US00RE40867E

(19) United States
(12) Reissued Patent
Binstead

(10) Patent Number: US RE40,867 E
(45) Date of Reissued Patent: Aug. 11, 2009

(54) MULTIPLE INPUT PROXIMITY DETECTOR AND TOUCHPAD SYSTEM

(76) Inventor: Ronald Peter Binstead, 15 Seely Road, Nottingham NG7 1NU (GB)

(21) Appl. No.: 10/279,828

(22) Filed: Oct. 24, 2002

Related U.S. Patent Documents

Reissue of:
(64) Patent No.: 6,137,427
Issued: Oct. 24, 2000
Appl. No.: 09/179,489
Filed: Oct. 27, 1998

U.S. Applications:
(63) Continuation of application No. 08/718,356, filed on Oct. 3, 1996, now Pat. No. 5,844,506, which is a continuation of application No. PCT/GB95/000767, filed on Apr. 5, 1995.

(30) Foreign Application Priority Data

Apr. 5, 1994 (GB) ..... 9406702

(51) Int. Cl.
*H03K 17/94* (2006.01)

(52) U.S. Cl. ..... 341/33; 341/34; 345/173; 345/174; 178/18.06; 400/479.1

(58) Field of Classification Search ..... 341/20, 341/33, 34; 345/173, 174; 178/18.05, 18.06; 200/511, 512; 400/479.1
See application file for complete search history.

(56) References Cited

U.S. PATENT DOCUMENTS 4,620,062 A * 10/1986 Mizzi et al. ..... 178/18.05
4,686,332 A * 8/1987 Greanias et al. ..... 345/173
4,725,696 A * 2/1988 Furukawa et al. ..... 345/173
4,745,240 A * 5/1988 Furukawa et al. ..... 178/18.05
4,745,241 A * 5/1988 Furukawa et al. ..... 345/173
4,954,823 A 9/1990 Binstead
5,117,071 A * 5/1992 Greanias et al. ..... 345/178
5,159,159 A * 10/1992 Asher ..... 178/18.05
5,459,463 A * 10/1995 Gruaz et al. ..... 341/33
5,844,506 A 12/1998 Binstead

FOREIGN PATENT DOCUMENTS

| | | | |
|---|---|---|---|
| DE | 39 10977 | | 10/1990 |
| DE | 3910977 | A * | 10/1990 |
| EP | 0078676 | A * | 5/1983 |
| EP | 0 078 676 | | 5/1983 |
| EP | 0609021 | A * | 8/1994 |
| EP | 0 609 021 | | 8/1994 |
| WO | WO 95/27334 | | 10/1995 |

* cited by examiner

*Primary Examiner*—Timothy Edwards, Jr.
(74) *Attorney, Agent, or Firm*—Altera Law Group, LLC

(57) ABSTRACT

A touchpad is formed of an electrically insulating membrane (10) with a first series of spaced apart conductors (12) on a first face of membrane (10) and a second series of spaced apart conductors (14) on or proximal thereto, in which there is no electrical contact between the first and second series of conductors (12, 14) Each conductor in the first and second series of conductors is sensitive to the proximity of a finger to modify the capacitance of the proximate conductor to detect the presence of the finger positioned close to that conductor. A scanning system operative to sample one of the conductors in turn from both the first and second series of conductors (12, 14) in order to measure and store a capacitance value associated with that respective conductor. The scanning system is operative to maintain all conductors (12-n, 14-n) at a common potential equal to the potential of the conductor being sampled when the remaining conductors are not actively being sampled by the scanning system.

100 Claims, 9 Drawing Sheets

First grid

Second grid

MULTIPLE INPUT PROXIMITY DETECTOR AND TOUCHPAD SYSTEM

Matter enclosed in heavy brackets [ ] appears in the original patent but forms no part of this reissue specification; matter printed in italics indicates the additions made by reissue.

The present application is a continuation of an application entitled "MULTIPLE INPUT PROXIMITY DETECTOR AND TOUCHPAD SYSTEMS", filed Oct. 3, 1996 and assigned Ser. No. 08/718,356, now U.S. Pat. No. 5,844,506 which is a national application based upon British PCT Application entitled "MULTIPLE INPUT PROXIMITY DETECTOR AND TOUCHPAD SYSTEM", assigned Ser. No. PCT/GB95/00767, filed Apr. 5, 1995, claiming priority to a British application entitled "MULTIPLE INPUT PROXIMITY DETECTOR AND TOUCHPAD SYSTEM", filed May 4, 1994 and assigned Ser. No. 9406702.2, all of which applications describe and claim inventions made by the present inventor.

The present invention relates to a multiple input proximity detector/touchpad system which may comprise, for example, a keypad array, digitising tablet, touchscreen or an electronic mouse which may be operated through a variable thickness of glass or other dielectric medium, and more particularly to the design of a multiple input proximity detector/touchpad system in which a large matrix of keys or a large touch sensitive area may be formed using the superposition of, for example, orthogonally arranged conducting elements. The conducting elements, and the electronic scanning system to service the conducting elements are particularly arranged to obtain optimized sensitivity.

In European Patent No. EP-0185671 there is described a touch operated keyboard for attachment to one face of a sheet of glass comprising a plurality of keypads disposed adjacent each other in a desired pattern, together with interrogation means for assessing the condition of the keypads, indicating when a keypad, or keypads have been operated by a user, and an electronic scanning and processing system for providing means for threshold value generation and drift compensation.

The threshold value generation means is operative to determine repeatedly at predetermined intervals the required capacitance level associated with any keypad in order to indicate that that keypad has been operated by a user.

The drift compensation means is operative to offset variations in capacitance caused by varying background conditions.

The present invention is directed towards the construction of a multiple input proximity detector/touchpad system, which may comprise a keypad array, digitising tablet, touchscreen or an electronic mouse, wherein the position of a user's finger or other object touching, or in close proximity to the "touch sensitive" surface area, hereinafter referred to as a touchpad, is determined by means of the capacitive effect of that finger on multiple conductor elements (hereinafter referred to as a keystroke), and to the optimisation of sensitivity of the touchpad, particularly when the touch sensitive area becomes relatively large. It is intended that throughout the present specification, reference to a "finger" is intended to include any object that would exert sufficient capacitive influence to be detected by the touchpad.

It should be noted that the activation of a "keypad" or area of the touchpad can be achieved without pressure on, or even without physical contact with, the surface of the touchpad, although in normal mode of operation, the user's finger would contact the touchpad surface or a surface associated therewith.

Other known types of touchpad, such as membrane switches having two sets of conductors face to face, require the use of pressure on two conducting elements at an intersection of those conducting elements. Pairs of conducting elements may be scanned in systematic manner to determine which, if any, intersection has been pressed. Disadvantages of this system are that there are moving parts (eg. the upper surface presented to the user's finger) which can therefore be subject to damage, and also that the positioning of the user's finger must coincide with the conducting element intersection. This method employs a set of driver conductors and a set of sensing conductors.

The present invention, however, uses only sensing conductors and has no moving parts. It can thus be well protected from damage by users by the glass or other dielectric medium covering the touchpad. The electronic scanning of the conducting elements requires connection to only one element at a time, and all other elements can be placed in condition to reduce interference when not being scanned. The present invention further permits detection of the user's finger at any point on the touchpad's active surface, and the electronic scanning mechanism could be arranged to assign predetermined areas of the touchpad to be interpreted as discrete keypads, or "boxes".

Of fundamental importance to such a touchpad system is the sensitivity of the apparatus to the proximity of a finger when compared with normal variations in capacitance. This ensures reliable indication of an intentional "keystroke" as previously described, and the determination with a high degree of accuracy of the position of that finger. The position of the finger may be a digital representation of which "box" or predetermined area of the touchpad has been activated from a set of possible boxes, or predetermined areas, or alternatively an analogue representation of the position by, for example, x-y coordinates.

The present invention is further directed towards the achievement of this required sensitivity, by a number of alternative embodiments which may be used separately or in conjunction with one another.

Applications of such a touchpad are many and diverse, for example:

- as a touchscreen interface for a computer system the keyboard being located immediately in front of a display unit which may be, for example, a cathode ray tube or liquid crystal display;
- a cash till keypad, where there would normally be many buttons for specific or different types of merchandise (the present invention is particularly suited to this application where the till operator is likely to have dirty or greasy hands, since the invention can provide a smooth glass for the keypad surface which is easily wiped clean);
- as an equivalent to a "mouse" input device to a computer system where the screen cursor is moved by moving one's finger across the surface of a touchpad;
- as a standard layout keyboard for use in a hostile environment;
- as many discrete proximity sensing keys.

In the environment of a cathode ray tube, or other static-or interference-generating device, it may be necessary to protect the touchpad from such static by known means, for example a transparent earthing shield. Alternatively, an actively driven back plane may be used.

In a general aspect the present invention provides a multiple input proximity detector in which the juxtaposition of two or more independent sensor inputs are used to determine the proximity of a finger, such detection only being accepted as valid when all the sensor inputs indicate a valid detection, where such inputs may be juxtaposed next to a range of other inputs in unique combination such that when any one combination gives a true detection for all its individual inputs, a unique valid detection is determined.

According to the present invention there is provided a touchpad comprising an electrically insulating membrane with a first series of spaced apart conductors on a first face of the membrane and a second series of spaced apart conductors on or proximal thereto, in which there is no electrical contact between the first and second series of conductors, each conductor in said series being sensitive to the proximity of a finger to modify the capacitance of said conductor to detect the presence of said finger positioned close to that conductor. Preferably the first and second conductors comprise fine wires preferably of a size between 10 to 25 microns to be substantially invisible when the touchpad is used as a touchscreen.

Embodiments of the present invention will now be described by way of example with reference to the accompanying drawings in which.

Figure 1:
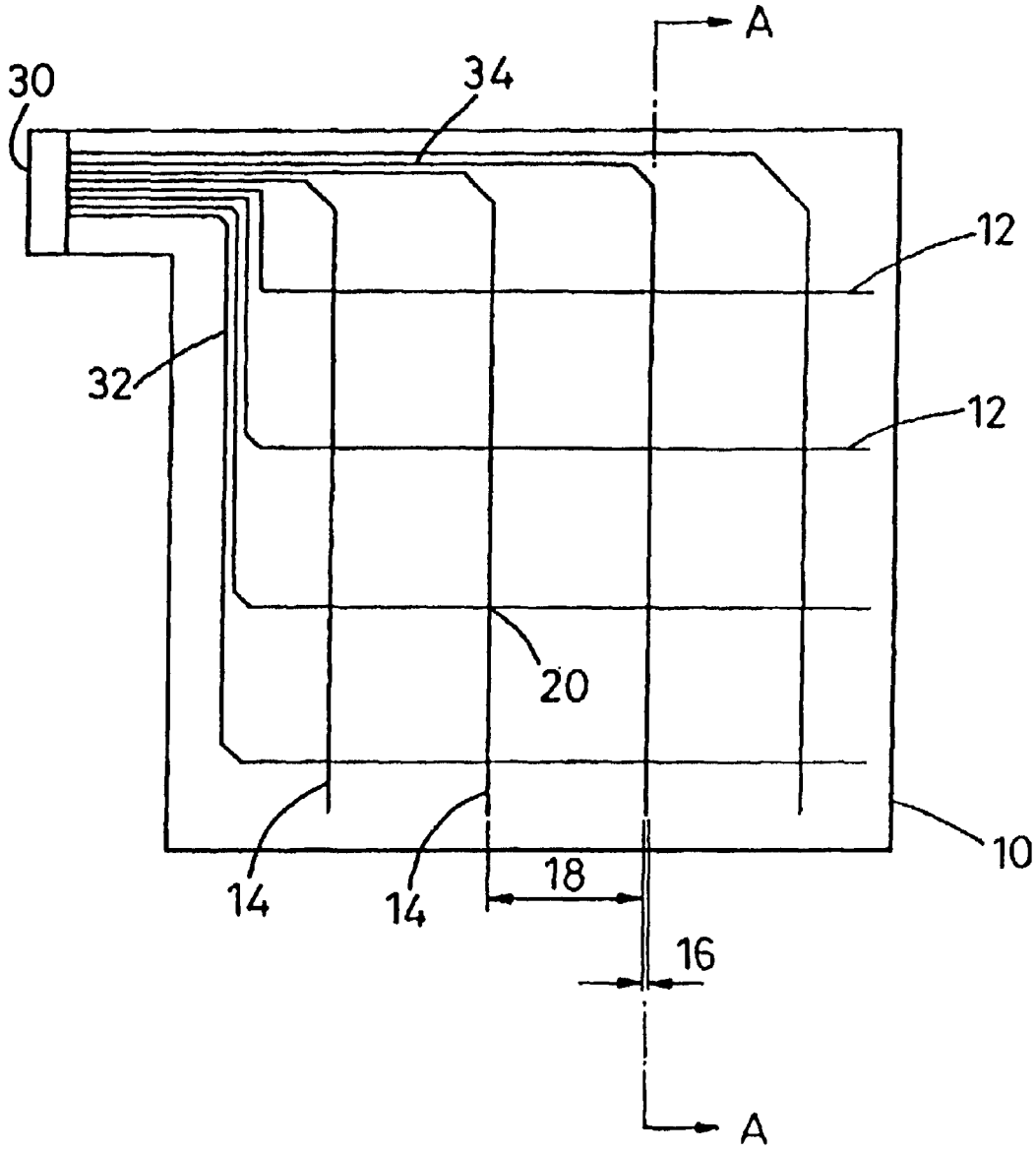
FIG. 1 shows in plan view a touchpad according to the present invention.
Figure 2C:
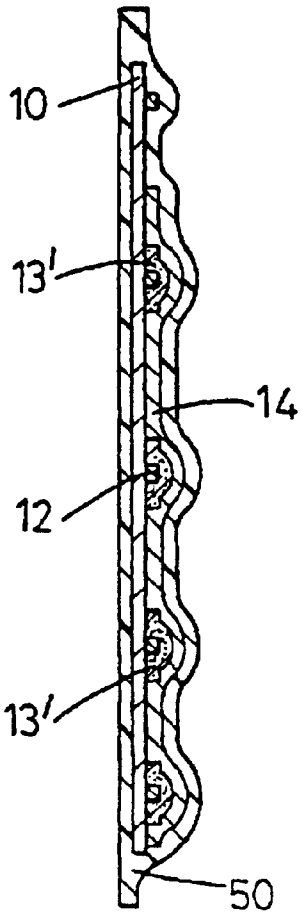
FIGS. 2a, 2b and 2c show in alternative embodiments cross-sections through the touchpad of FIG. 1, not to scale.
Figure 2B:
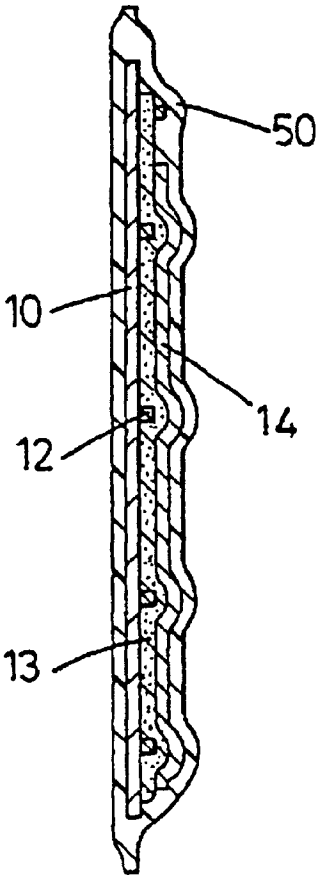
Figure 2A:
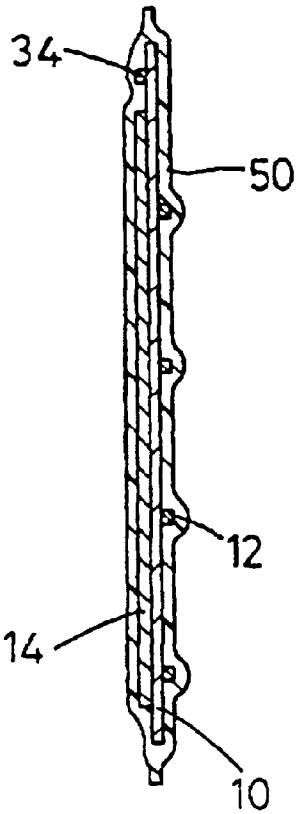

With reference to FIGS. 1 and 2a, and according to one embodiment of the invention, there is provided a thin dielectric film 10 on which is deposited on one face by an appropriate technique such as screen printing or similar lithographic process, a pattern of electrically conducting material forming a first series of parallel conductor elements 12 with appropriate connections at one or both ends. On the other face of the thin dielectric film 10, by a similar technique, there is provided a pattern of electrically conducting material forming a second series of parallel conductor elements 14 with appropriate connections at one or both ends which are orthogonal to, but not in electrical contact with the first series. The first and second series of conductor elements thus form a plurality of intersections 20. Appropriate material for these conductor elements 12, 14 is, for example, silver-based conducting ink. If the conductor elements are to be of low visibility where the touchpad is being used in front of a display system, then indium oxide is an appropriate material.

In other embodiments, the first and second series of conductor elements need not be parallel, nor is it necessary for the first and second series of conductor elements to be mutually orthogonal. The second series of conductor elements may be deposited onto a second thin dielectric film, the second film being superimposed on the first dielectric film in order to achieve similar effect of separation of the first and second series of conductor elements by a dielectric layer.

It is also possible to effect the superposition of the conducting elements in other ways. For example, in FIG. 2b the first series of conductor elements 12 may be deposited onto the thin dielectric film 10 and an insulating layer 13 deposited thereupon. The second series of conducting elements 14 may then be deposited over the insulating layer. Thus, the insulating layer 13 forms a membrane structure between the first and second series of conducting elements.

The insulating layer 13 need not, however, be continuous over the entire touchpad surface: it is only necessary to insulate the intersections of the first and second series of conductor elements. In FIG. 2c, this arrangement is shown, where small regions of insulating material 13' are deposited over the first series of conducting elements 12 at the proposed intersection points. The second series of conductor elements 14 may then be deposited. In this instance, the small regions of insulating material 13' in conjunction with the dielectric film 10 form a membrane structure separating the first and second series of conductor elements.

Connection to the conductor elements 12 and the conductor elements 14 is made by further conducting elements 32, 34 respectively deposited and/or defined in similar manner to conductor elements 12, 14. A connection to the touchpad scanning system is made by connector 30 using an appropriate connection system.

In the embodiments of FIGS. 1 and 2a–2c, the width 16 of the conductor elements 12 and 14 is small compared with the inter-element spacing 18. If the conducting material being used to form conductor elements 12, 14 is of low conductivity, an alternative pattern of conductor element may be used as described later.

In another embodiment, the inter-element spacing 18 need not be identical for each adjacent pair of conductor elements.

The sensitivity of the touchpad and its immunity to extraneous interference has been found to be enhanced by the encapsulation of the dielectric film 10 and conducting elements 12, 14, 32, 34 in a dielectric laminate 50, as shown in FIGS. 2a–2c The dielectric laminate may be a plastic film, and can be formed using well known techniques such as heat sealing. This provides a constant dielectric environment in the immediate proximity of the conductor elements, eliminates the influence of moisture which might otherwise be present on the conductor elements, and further improves the robustness of the apparatus.

High sensitivity to changes in capacitance of a conductor element or group of conductor elements caused by the proximity of a finger or other object is achieved by minimising the cross-coupled capacitance between the conductor elements 12 and the conductor elements 14. This can be achieved in one embodiment by the use of highly conductive material (such as silver) and the forming of conductor elements which have a very narrow width 16 when compared to the conductor spacing 18 as previously described, such that the capacitance of the intersections 20 is small. In the event that it is desirable that a lower conductivity material be used (e.g. indium oxide), or that the dimensions of the touchpad become sufficiently large such that there is substantial resistance along a conductor element, then alternative patterns may be considered such as those embodied in FIGS. 3a and 3b.

Figure 3A:
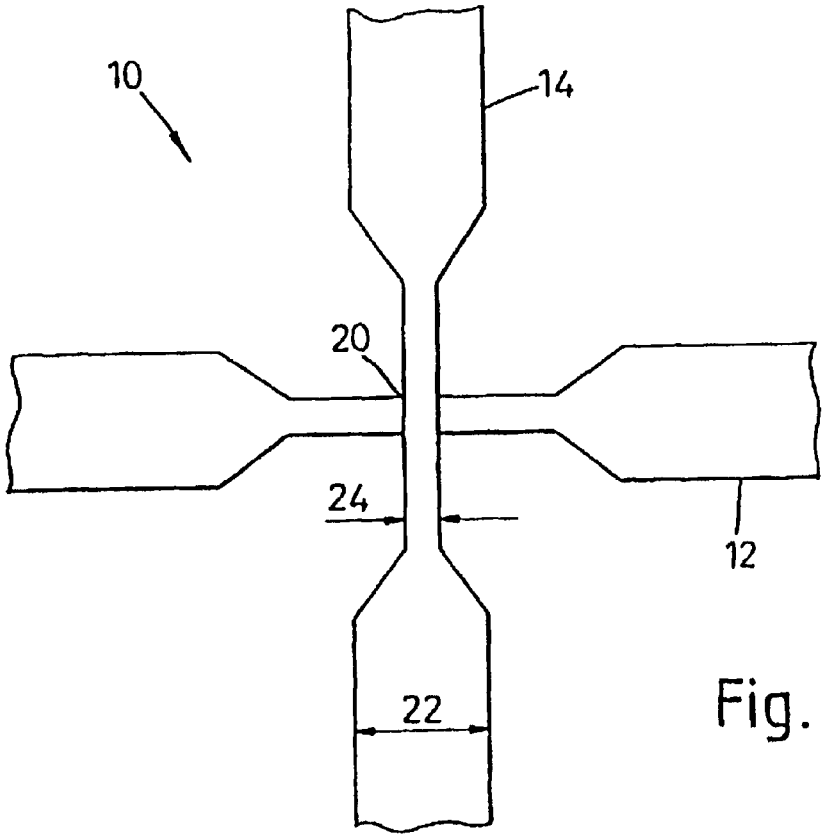
FIGS. 3a and 3b show embodiments of intersection points of two conducting elements.

In FIG. 3a, where the conductor elements have a more substantial width 22, at the intersections 20 and width 24 is greatly reduced.

Figure 3B:
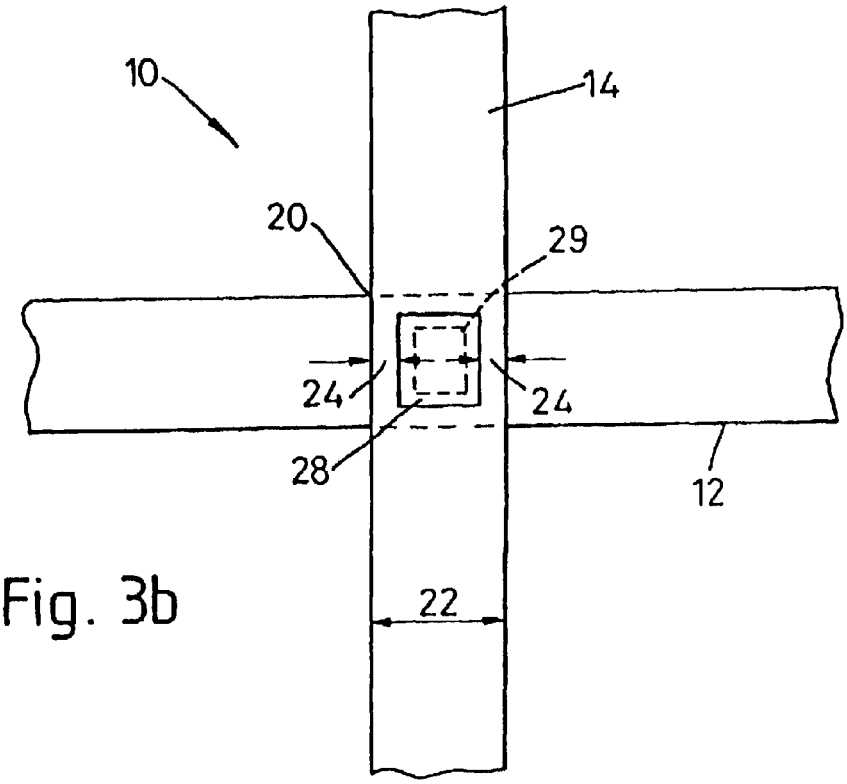

In FIG. 3b, the conductor elements 12 and 14 maintain full width 22, but the second conductor element 14 has a "window" area 28 which has no conductive material. This "window" allows the necessary capacitive link to the first conductive element 12. The window area 28 need not be completely open. As indicated by dotted line 29, an area of conductor material electrically isolated from the second conductor element 14 can in fact be left within the window 28 and still provide the necessary capacitive link to the first conductor element 12.

The relative thicknesses of the conductor elements thus can be varied to suit the conductivity of the material being used, the length of the tracks, and other constraining factors. It is noted that the smaller width tracks can result in better resolution and higher speed of operation, but use of the wider tracks can be acceptable for lower resolution, less sensitive or slower requirements.

Figure 4:
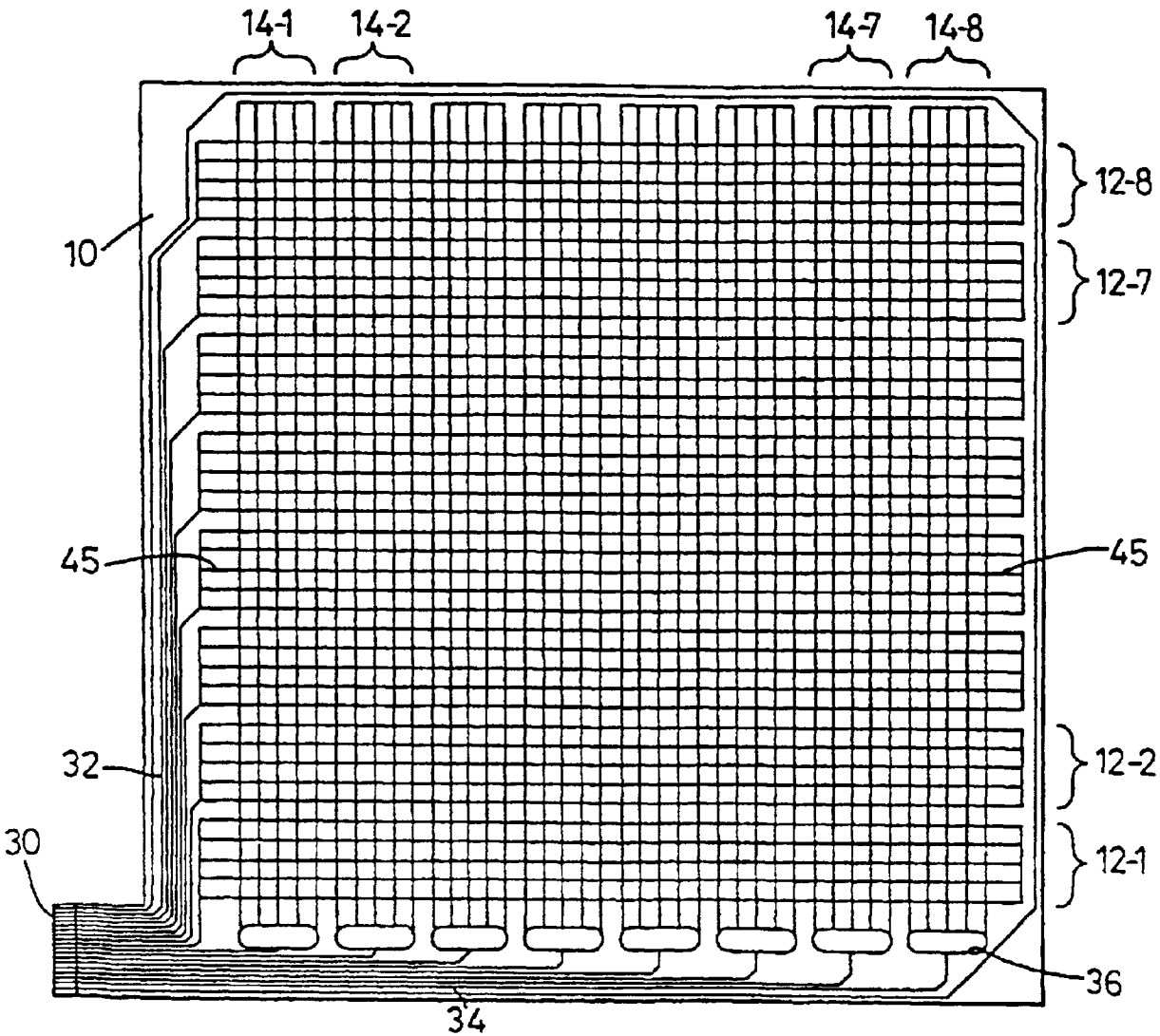
FIG. 4 shows in plan view an embodiment of the present invention suitable for a large area touchpad with multiple conducting elements.

In another embodiment, the sensitivity to changes in capacitance caused by the proximity of a finger or other object to a large area touchpad is enhanced by connecting several conductor elements 12, 14 together in groups as embodied in FIG. 4. This particular embodiment is preferred where the required positional resolution of a keystroke can be compromised in favour of an increased area of touchpad. This particular embodiment confers upon the apparatus the additional benefit that damage to one of the conductor elements 12 or 14 causing a break in that element does not affect the performance of the system, provided that the connection of each group of elements at both ends is made, as shown in the embodiment of FIG. 4. If a fine wire is used to detect a large area then the wire should be zig-zagged over that area. The wire could be zig-zagged with ¼–⅕th of an inch spacing.

Figure 5:
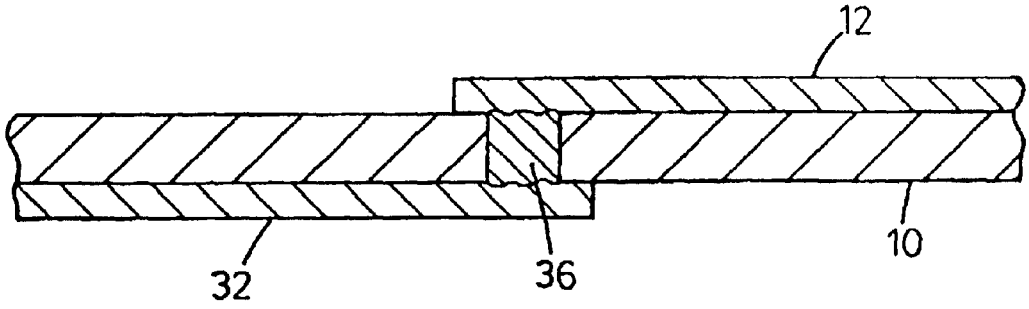
FIG. 5 shows in cross-section an embodiment of the present invention in which connections can be made between conducting elements.

If required, the conductor elements can be electrically connected to elements on the opposite face of the dielectric film 10 by the provision of appropriately placed holes 36 in the dielectric film as shown in FIGS. 4 and 5, filled with conductive material through which, for example, conductor element 12 is connected to conductor element 32 in order that connector 30 is only required to make contact to one face of the dielectric film 10. Such a system may also be used to form "underpasses" for the conductor elements if required on particularly complex conductor patterns. These "underpasses" may be used to effect the intersection points of the first series of conductor elements 12 and the second series of conductor elements 14.

It is further noted that where conductor elements are used which have significant resistance along the length thereof, it is possible to minimise the impact this has by providing conductor elements 32,34 to contact both ends of conductor elements 12,14 respectively. It is further possible to provide conductor elements 32,34 in high-conductivity material, and conductor elements in the lower conductivity material, the elements being coupled together in known manner.

In a particular embodiment of this invention the required sensitivity of the system to changes in capacitance on any given element is enhanced by ensuring that all of the conductor elements 14-1 . . . 14-n and 12-1 . . . 12-n are maintained at the same potential (for example ground potential, or $V_{supply}$ hereinafter referred to as "ground potential") except for the conductor element being sampled. The grounding of all conductor elements not being sampled greatly reduces the effect of stray capacitance from other parts of the touchpad on the element being sampled, thus providing a more reliable measure of any capacitive change that may have taken place on the conductor element being scanned.

Figure 8:
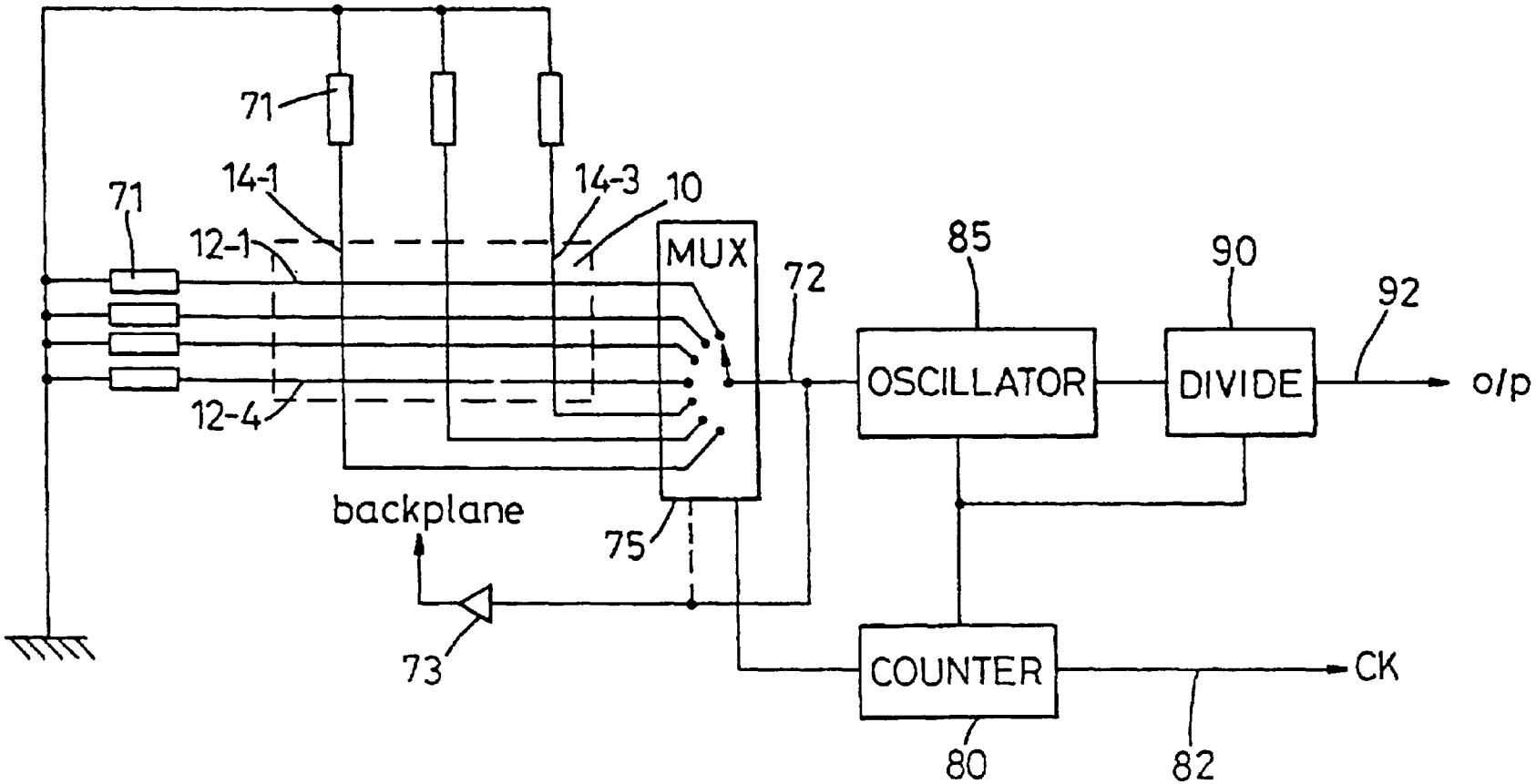
FIG. 8 shows schematically an embodiment of scanning apparatus suitable for use with the touchpad.

An appropriate system for scanning keyboards, such as that described in European Patent No. 0185671 is readily applicable with some modification to this touchpad. In one particular embodiment as shown in FIG. 8, each of conductor elements 12-1 to 12-4, and 14-1 to 14-3 is connected at one end to a resistor 71 having a high value such as 100 kohms when compared with the impedance of the detection circuit, for example 10 kohms. (The particular values of resistance used are exemplary, and may be substantially varied according to the configuration of the system.) Each of the resistors is connected to, for example, ground potential. The other end of each of conductor elements 12-1 to 12-4, and 14-1 to 14-3 is connected in turn via analogue multiplexer 75 to Output line 72.

Where there is significant resistance along the length of the conductor elements 12 and 14, improvements in the performance of the detection system can be achieved by the placing of the resistors 71 at the opposite sides of the conductor elements 12 and 14 to that shown in FIG. 8. In other words, the resistors are placed at the multiplexer 75 of the touchpad and connected to ground or an active ground as hereinafter described.

Output line 72 is connected to the input of a capacitance controlled oscillator 85, the output of which is connected to a divide-by-n circuit 90, which provides the data output on line 92. An indexing counter 80, clocked by a remote clock on line 82, is operative to control the analogue multiplexer, and to reset capacitance controlled oscillator 85 and divide-by-n circuit 90. A processing means, not shown, is operative to receive the data from divide-by-n counter on line 92, and store it in a plurality of locations, each allocated to a particular one of the conductor elements 12 and 14. Divide-by-n circuit 90 and other components such as indexing counter 80 could be provided by means of a suitable standard microprocessor.

The scanning system thus samples each conductor element in turn according to the analogue multiplexer sequence, and stores each capacitance value in memory. These values are compared with reference values from earlier scans, and with other capacitance values in the same scan from the other conductor elements in order to detect a keystroke. Keystrokes must be above a threshold value to be valid. By having several threshold values it is possible to determine the pressure of key press or distance that the finger is away from the key. This may be useful, for example, when moving a cursor across a screen and then making a selection by pressing harder on a selected point.

The remaining features of the scanning mechanism are well described in the cited document and will not be discussed further here.

Figure 6:
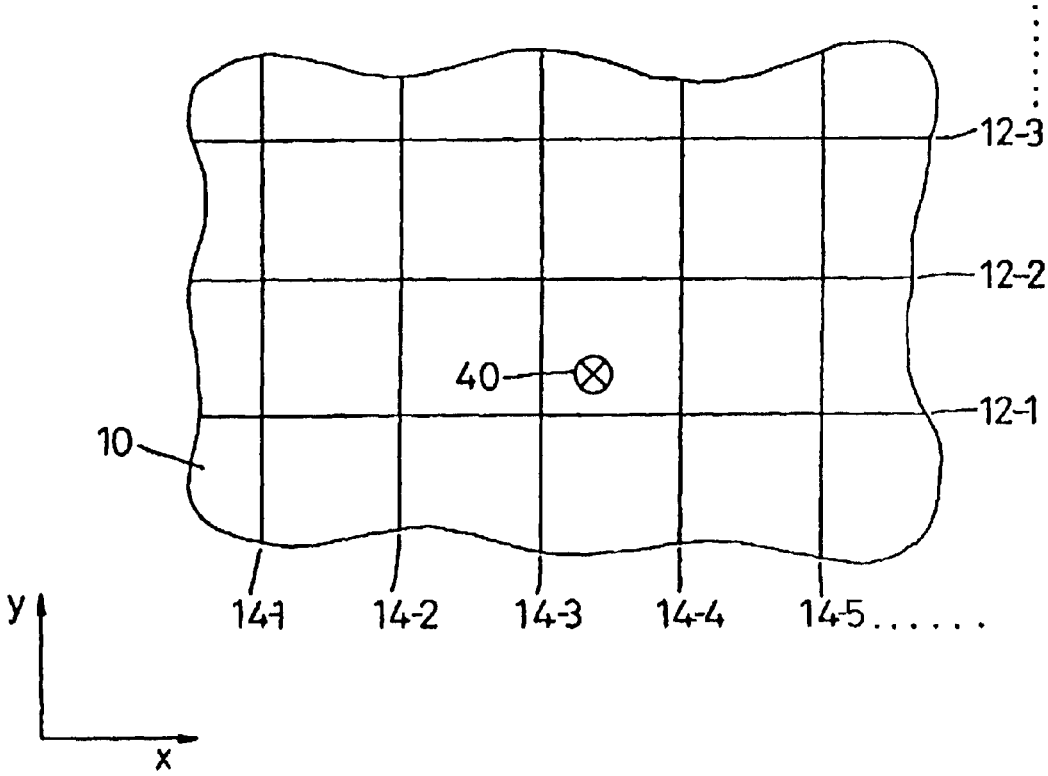
FIG. 6 shows a small part of a touchpad surface.

Detected changes in capacitance on more than one conductor element in any one scanning sequence enables interpolation of a keystroke between those conductor elements. In the two dimensional case, as shown in FIG. 6, conductor element 14-3, and conductor element 14-4 cross conductor elements 12-1 and 12-2. A finger or other object at position 40 can be determined in the X-direction by the relative effect on the capacitance of element 14-3 compared with element 14-4, and in the Y-direction by the relative effect on the capacitance of element 12-1 compared with element 12-2. In a typical application, conductor elements 12-1,12-2 . . . 12-n and 14-1,14-2 . . . 14-n will be sampled by the scanning system in a sequential manner. Clearly, the same applies to the embodiment of the touchpad where the conductor elements are arranged in groups where the interpolation is made between the centre line 45 of each group of conductor elements (FIG. 4).

Figure 7:
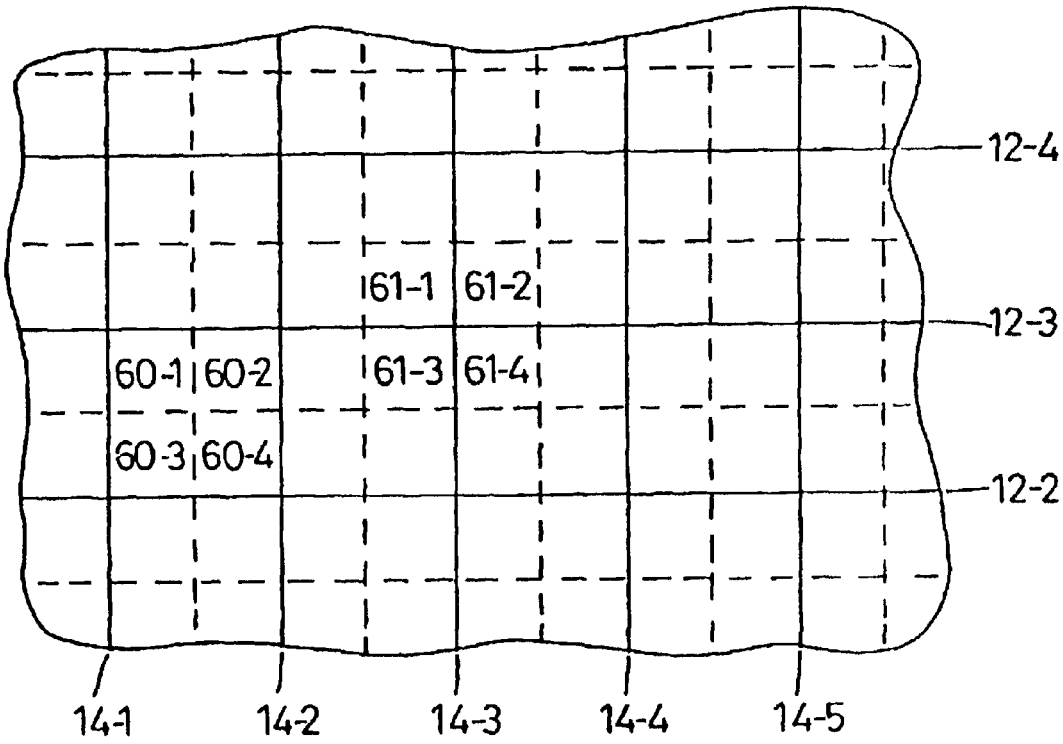
FIG. 7 shows a part of a touchpad surface indicating an embodiment of the invention in which multiple keypad areas are assigned to each intersection.

It will be clear that the interpolation technique enables not only an analogue representation of finger position on the touchpad to be created, but also allows the use of an increased number of "boxes" or predetermined key areas 60,61 over the number of element intersections, as indicated in FIG. 7. Such "boxes" or keypad areas could be arranged in any number of configurations capable of being resolved by the system.

In an alternative embodiment, an active backplane may be incorporated into the touchscreen. For example, a plastic sheet upon which is coated a conductive film is laminated to the touchscreen. The output 72 is connected to a unity gain non-inverting amplifier 73. The output of this amplifier 73 is connected to the backplane conductor (not shown) which may cover all or part of the keypad. The backplane will be active since the voltage thereon will vary with the output on line 72.

The backplane could also extend to areas in front of the keypad to "shield" keys which are non-operative.

The backplane potential thus created could also be suitably connected to maintain all conductors 12-n, 14-n which are not actively being sampled at a common potential equal to the active backplane potential rather than the common ground potential as previously described herein.

This can in certain uses of the touchscreen eliminate the requirement for a completely conductive backplane film.

Figure 9:
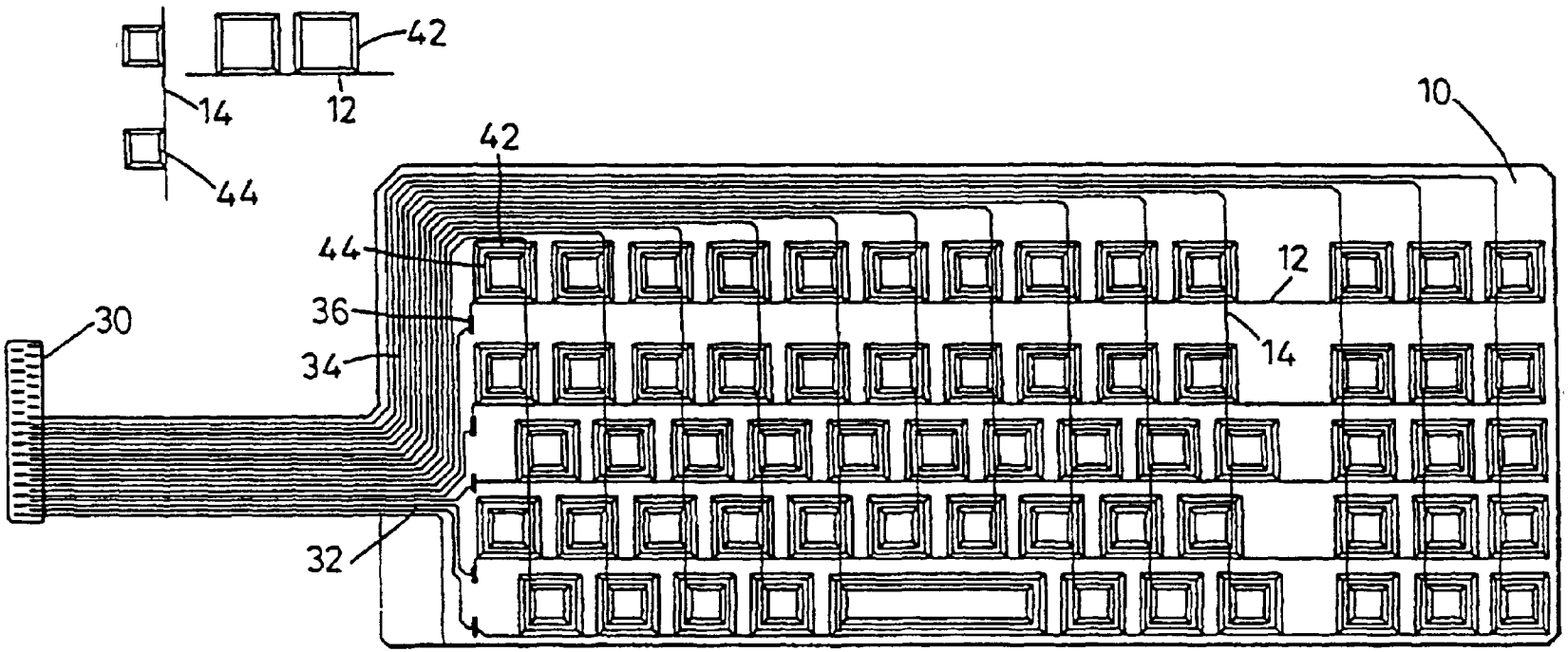
FIG. 9 shows a pattern of conductor elements suitable for use in the style of a standard typewriter keyboard layout.

In FIG. 9 there is shown an example of an appropriate pattern of elements for simulating a keypad configuration such as that normally associated with a typewriter keyboard. This particular embodiment comprises the horizontal conducting elements 12, vertical conductor elements 14, conducting elements 32, 34 for connection to connector 30 in similar manner to the embodiments described with reference to the FIGS. 1 and 2. The sensitivity of the system can be further enhanced by the addition of further conducting elements 42, 44; elements 42 being in electrical connection with conducting elements 12, and elements 44 being in electrical connection with conductor elements 14, elements 42 being positioned such that centre of a box defined by the elements 42 is superimposed on the centre of a box defined by elements 44, the elements 12, 42 being on one face of the thin dielectric film 10, and the elements 14, 44 being on the other face of the thin dielectric film 10. The separate elements 42, 44 are indicated schematically to the side of the drawing of FIG. 9.

As indicated earlier, the first and second series of conductor elements 12 and 14 need not be deposited on opposite faces of the same dielectric membrane, but might be deposited on separate dielectric membranes, with said membranes being superimposed one on the other. This principle may be extended to include a plurality of membranes, each having a separate pattern of conductor elements. These could, for example be PCB's (printed circuit boards) of known type.

The conductor elements 12,14,32 and 34 could be formed from fine conducting wires which would preferably be insulated by, for example, an enamel coating. The wires 12,14 could be allowed to touch at intersections 20, electrical contact being prevented by the insulating coating. Alternatively, the wires could be arranged on either side of a suitable membrane for mounting purposes. The wires may be from 10 to 25 microns in diameter thereby being invisible to the naked eye when the invention is used as a touchscreen.

In a further embodiment of the present invention, particularly an embodiment including, for example, a plurality of membranes having conductor elements thereon, multiplexing techniques can be used. Duplicate sets of N small touchpads are arranged to form a large touchpad array. This array is superimposed upon a larger touchpad with M keys (M could be equal to N). The position of a finger or other object proximate to the first touchpad is interpretable by the system as a key stroke in any one of N possible positions. The second, larger grid pattern is used to determine which of the M possible duplicate key pads has been touched, enabling unambiguous determination of the position of the finger.

Figure 10:
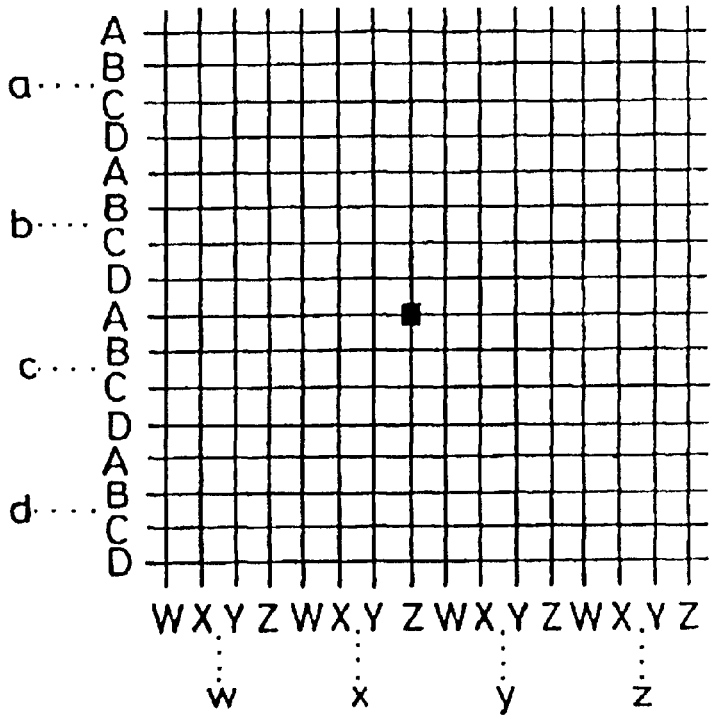
FIG. 10 shows a pattern of conductor elements demonstrating one embodiment of a multiplexed touchpad.
Figure 10:
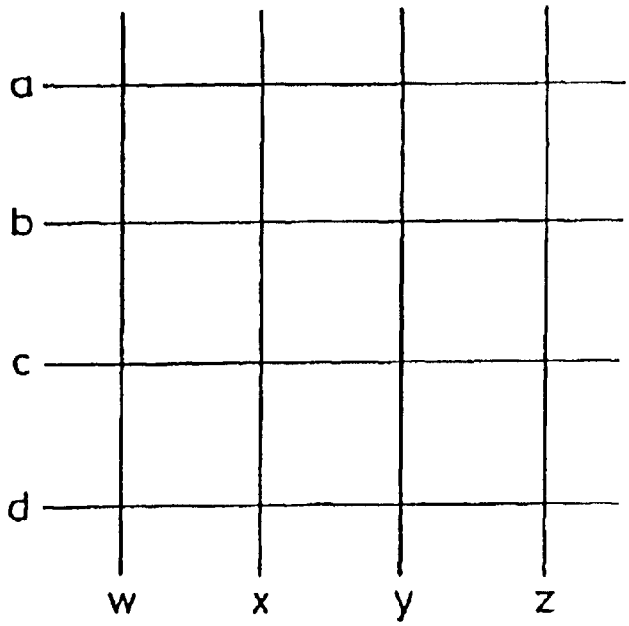

With reference to FIG. 10, there is a first grid pattern comprising repeating pattern of elements A to D and W to Z; that is to say that all A elements are electrically connected, all B elements are electrically connected, and so on. It is thus apparent that there will be four first grid horizontal connections A,B,C,D, and four first grid vertical connections W,X, Y,Z. A second grid is placed directly over the first grid, the second grid having four horizontal elements with four connections a,b,c,d, and four vertical elements with four connections w,x,y,z. A finger placed at the position marked with a square on the first grid will be indicated by the first grid as interference with elements A and Z. Such interference would be the same for sixteen positions on this grid, but the second grid will indicate interference with elements c and b, with c stronger than b, and interference with elements x and y, with x stronger than y. This enables unique determination of the position of the interfering object. It is readily apparent that 256 positions can thus be resolved by just 16 electrical connections. If interpolation techniques are used, more than 256 positions can be resolved.

If enamel coated wires are used then because these are insulated from each other a plurality of matrix wire arrangements can be placed on top of each other without any separating membrane.

More keys can be determined by duplicating or rearranging the order of the connections and thus determining the unique best and second best values. For example, instead of A,B,C,D, as above the order D,A,B,C,D,B, could be used.

If D gives the best value in the above example and C is the second best then it is the second D that has been selected.

If D gives the best value and A is the second best then it is the first D that has been selected.

This example can be accomplished in a linear or in a grid pattern to provide more key positions and thus can be used in combination with the interpolation techniques to provide even more key positions.

The grid patterns could be arranged as shown in FIG. 10 to be evenly spaced, but equally each four by four pattern (A–D, W–Z) could be arranged, within reason, at any location on the touchpad surface or on another surface thus providing 16 separate and distinct four by four arrays. In the extreme case, each array could be constructed to be a single key, the example shown thus providing 256 keys at remote locations but not necessarily in a defined pattern.

In a very large keyboard, it may be required to sample the elements more quickly. This can readily be achieved by sampling several elements at once. Thus for a 16×8 array, rows 1 and 9 might be sampled simultaneously, 2 and 10, 3 and 11 and so on. If only one keypad is to be operated at any one time, unambiguous determination can be obtained, since the rows will be sufficiently far apart that a stray signal will not be possible.

The outputs may be fed to different inputs of a multiplexer circuit and then to a common detector circuit. In the event that two valid outputs are received, a comparison would be made to determine the best signal, or a fault indicated requiring a further keystroke.

It will be readily apparent that the use of multiple layers of dielectric membranes could readily be scanned by several detector circuits in communication with one another.

It is further noted that the use of a first series of thin conductor elements as described herein may effectively be used to form discrete pad areas as, for example element 42 in FIG. 9 each with a separate connector line to the scanning mechanism, and without the use of a second series of conductor elements.

What is claimed is:

1. A touchpad comprising an electrically insulating membrane (10), a first series of spaced apart wires (12) disposed on a first face of said membrane (10) and a second series of spaced apart wires (14) proximal to said membrane, there being no electrical contact between said first and second series of spaced apart wires (12, 14), each wire of said first and second series of spaced apart wires being sensitive to the proximity of a finger to modify the capacitance of the wire in proximity to the finger to detect the presence of the finger positioned in proximity to that wire each wire of said first and second series of wires having a diameter in the range of about 10 microns to about 25 microns.

2. A touchpad comprising an electrically insulating membrane (10) with a first series of spaced apart conductors (12) on a first face of said membrane (10) and a second series of spaced apart conductors (14) on or proximal thereto, in which there is no electrical contact between said first and second series of conductors (12, 14), each conductor in said first and second series of conductors being sensitive to the proximity of a finger to modify the capacitance of said conductor to detect the presence of the finger positioned close to said conductor, said first and second series of conductors (12, 14) comprising very fine wires, said wires being enamel coated and being in the range of about 10 microns to about 25 microns in diameter and a scanning system operative to sample each one of the conductors in turn from both said first and second series of conductors (12, 14) in order to measure and store a capacitance value associated with that respective conductor, said scanning system being operative to maintain all conductors of said first and second series of conductors (12-n, 14-n) at a common potential when said conductors are not actively being sampled by said scanning system.

3. A touchpad comprising an electrically insulating membrane (10) with a first series of spaced apart wires (12) on a first face of said membrane (10) and a second series of spaced apart wires (14) proximal thereto, in which there is no electrical contact between the first and second series of spaced apart wires (12, 14), each wire of said first and second series of spaced apart wires being sensitive to the proximity of a finger to modify the capacitance of the wire to detect the presence of the finger positioned close to that wire, said first and second series of wires having a diameter in the range of about 10 microns to about 25 microns, including a scanning system operative to sample a said one of said wires in turn from both said first and second series of spaced apart wires (12, 14) in order to measure and store a capacitance value associated with that respective wire, wherein the scanning system is operative to maintain all wires (12-n, 14-n) at a common potential equal to the potential of the wire being sampled when said first and second series of spaced apart wires are not actively being sampled by said scanning system.

4. A touchpad as claimed in claim 3 in which said scanning system comprises a multiplexer (75), individual inputs of which are respectively connected to a first end of each respective wire operative to scan each wire said first and second series of spaced apart wires in a defined order such that only one wire is connected to the output of the multiplexer at any time instant and including voltage driving means an input of which is connected to the output of said multiplexer and an output of said voltage driving means is connected to all wires of said first and second series of spaced apart wires (12-n, 14-n), said voltage driving means thereby maintaining the voltage level on each wire of said first and second series of spaced apart wires (12-n, 14-n) at a common potential, which common potential is equal to the output voltage potential of the wire being sampled at that time instant.

5. A touchpad as claimed in claim 4 in which said voltage driving means comprises a unity gain amplifier, the output of which is held at the same voltage as the input, thereby maintaining the voltage level of all wires of said first and second series of spaced apart wires at the same potential.

6. A touchpad as in claim 4 wherein each of the wires of said first and second series of spaced apart wires is formed from a plurality of electrically connected conducting elements.

7. A touchpad comprising an electrically insulating membrane (10) with a first series of spaced apart wires (12) on a first face of said membrane (10) and a second series of spaced apart wires (14) proximal thereto, in which there is no electrical contact between said first and second series of spaced apart wires (12, 14), each wire in said first and second series of spaced apart wires being sensitive to the proximity of a finger to modify the capacitance of the wire to detect the presence of the finger positioned close to that wire, each wire of said first and second series of wires having a diameter in the range of about 10 microns to about 25 microns including a scanning system operative to sample a wire in turn from both said first and second series of spaced apart wires (12, 14) in order to measure and store a capacitance value associated with that respective wire, wherein said scanning system is operative to maintain all wires of said first and second series of spaced apart wires (12-n, 14-n) at a common potential equal to the potential of the wire being sampled when said first and second series of spaced apart wires are not actively being sampled by said scanning system and in which said scanning system comprises a multiplexer (75), individual inputs of which are respectively connected to a first end of each respective wire operative to scan each wire of said first and second series of spaced apart wires in a defined order such that only one wire is connected to the output of said multiplexer at any time instant and including voltage driving means an input of which is connected to the output of said multiplexer and an output of said voltage driving means is connected to all wires of said first and second series of spaced apart wires (12-n, 14-n), said voltage driving means thereby maintaining the voltage level on each wire of said first and second series of spaced apart wires (12-n, 14-n) at a common potential, which common potential is equal to the output voltage potential of the wire being sampled at that time instant.

8. A touchpad useable as a touch screen comprising an electrically insulating membrane (10) with a first series of spaced apart conductors (12) on a face of said membrane (10) and a second series of spaced apart conductors (14) on or proximal thereto, in which there is no electrical contact between the first and second series of spaced apart conductors (12, 14), each conductor of said first and second series of conductors having a width in the range of about 10 microns to about 25 microns, each conductor in said first and second series of spaced apart conductors being sensitive to the proximity of a finger to modify the capacitance of conductor to detect the presence of the finger positioned close to that conductor characterized in that said first and second series of spaced apart conductors (12, 14) comprise very fine insulation coated electrically conductive conductors.

9. A touchpad as set forth in claim 8 in which said conductors are enamel coated.

10. touchpad as set forth in claim 8 wherein said second series of spaced apart conductors (14) is attached to a further electrically insulating membrane (13).

11. A touchpad as set forth in claim 8 wherein said first and second series of spaced apart conductors (12, 14) are arranged to form a plurality of intersections (20) between said first series of spaced apart conductors and said second series of spaced apart conductors.

12. A touchpad as set forth in claim 8 in which said touchpad includes an active backplane device.

13. A touchpad as set forth in claim 8 wherein said second series of spaced apart conductors (14) is attached to said face of said insulating membrane (10), said first series of spaced apart conductors (12) being insulated from said second series of spaced apart conductors (14) by discrete regions of insulating material (13').

14. A touchpad as set forth in claim 13 wherein said membrane and said insulating material (10, 13') and said first and second series of spaced apart conductors (12, 14) are laminated between dielectric films (50).

15. A touchpad as set forth in claim 8 wherein said second series of spaced apart conductors (14) are formed on a further face of said membrane (10).

16. A touchpad as set forth in claim 15 wherein said second series of spaced apart conductors (14) is attached to a further electrically insulating membrane (13).

17. A touchpad as set forth in claim 16 wherein said membrane and said further membrane including said first and second series of spaced apart conductors (12, 14) are superimposed one above another and a plurality of scanning mechanisms for scanning said first and second series of spaced apart conductors.

18. A touchpad useable as a touch screen comprising an electrically insulating membrane (10) with a first series of spaced apart conductors (12) on a face of said membrane (10) and a second series of spaced apart conductors (14) on or proximal thereto, said second series of spaced apart conductors (14) being attached to said face of said insulating membrane (10), said first series of spaced apart conductors (12) being insulated from said second series of spaced apart conductors (14) by discrete regions of insulating material (13'), the conductors of said first series of spaced apart conductors intersecting at intersections with the conductors of said second series of spaced apart conductors, each of the conductors of said first and second series of spaced apart conductors having a first width (22) for the larger part of their length, and a second width (24) being substantially smaller than the first width, which second width is coincidental with each of said intersections (20), each conductor in said first and second series of spaced apart conductors being sensitive to the proximity of a finger to modify the capacitance of conductor to detect the presence of the finger positioned close to that conductor characterized in that said first and second series of spaced apart conductors (12, 14) comprise very fine insulation coated electrically conductive conductors.

19. A touchpad system including a touchpad comprising an electrically insulating membrane (10) with a first series of spaced apart conductors (12) on a face of said membrane (10) and a second series of spaced apart conductors (14) on or proximal thereto, in which there is no electrical contact between the first and second series of conductors (12, 14), each conductor of said first and second series of conductors having a width in the range of about 10 microns of about 25 microns, each conductor of said first and second series of spaced apart conductors being sensitive to the proximity of a finger to modify the capacitance of a conductor to detect the presence of the finger positioned close to that conductor characterized in that said first and second series of spaced apart conductors (12, 14) comprise very fine insulation coated electrically conductive conductors including a scanning system operative to sample in turn each conductor from both said first and second series of spaced apart conductors (12, 14) in order to measure and store a capacitance value associated with that respective conductor.

20. A touchpad system as set forth in claim 19 wherein said scanning system is operative to maintain all conductors (12-n, 14-n) of said first and second series of spaced apart conductors at a common potential when none of the conductors are being actively sampled by said scanning system.

21. A touchpad system as set forth in claim 19 wherein said scanning system is capable of determining the position of the finger relative to two or more conductors of said first and second series of spaced apart conductors by means for interpolating the degree of difference in capacitance of the associated conductors.

22. A touchpad system as set forth in claim 20 wherein the surface area of said touchpad is divided into a plurality of boxes (60, 61), the presence of a finger positioned on any one box being distinguishable by said system from a finger positioned on any other box.

23. A touchpad system including a touchpad useable as a touch screen comprising an electrically insulating membrane (10) with a first series of spaced apart conductors (12) on a face of said membrane (10) and a second series of spaced apart conductors (14) on or proximal thereto, in which there is no electrical contact between the first and second series of conductors (12, 14), each conductor of said first and second series of spaced apart conductors being sensitive to the proximity of a finger to modify the capacitance of a conductor to detect the presence of the finger positioned close to that conductor characterized in that said first and second series of spaced apart conductors (12, 14) comprise very fine insulation coated electrically conductive conductors, a scanning system operative to sample in turn each conductor from both said first and second series of spaced apart conductors (12, 14) in order to measure and store a capacitance value associated with that respective conductor and an active backplane device and wherein said scanning system is operative to maintain all conductors of said first and second series of spaced apart conductors at the same potential as said active backplane device when the conductors are not being actively sampled by said scanning system.

24. A touchpad useable as a touch screen comprising an electrically insulating membrane (10) with a first series of spaced apart conductors (12) on a face of said membrane (10) and a second series of spaced apart conductors (14) on or proximal thereto, in which there is no electrical contact between the first and second series of spaced apart conductors (12, 14), each conductor in said first and second series of spaced apart conductors being sensitive to the proximity of a finger to modify the capacitance of conductor to detect the presence of the finger positioned close to that conductor characterized in that said first and second series of spaced apart conductors (12, 14) comprise very fine insulation coated electrically conductive conductors oriented in a zigzag manner.

25. A multiple input proximity detector including at least one touchpad useable as a touch screen comprising an electrically insulating membrane (10) with a first series of spaced apart conductors (12) being disposed on a face of said membrane (10) and a second series of spaced apart conductors (14) on or proximal thereto, in which there is no electrical contact between the first and second series of spaced apart conductors (12, 14), each conductor of said first and second series of conductors having a width in the range of about 10 microns to about 25 microns each conductor in said first and second series of spaced apart conductors being sensitive to the proximity of a finger to modify the capacitance of the conductor in proximity to the finger to detect the presence of the finger characterized in that said first and second series of spaced apart conductors (12, 14) comprise very fine insulation coated electrically conductive conductors and in which the juxtaposition of two or more independent capacitance inputs are used to detect the proximity of a finger, such detection only being accepted as valid when all the conductor capacitance inputs indicate a valid detection, where such inputs may be juxtaposed next to a range of other inputs in unique combination such that when any one combination gives a true detection for all its individual inputs, a unique valid detection is determined.

*26. A touchpad comprising an electrically insulating membrane, a first series of spaced apart electrical conductors disposed on a first face of said membrane and a second series of spaced apart electrical conductors proximal to said membrane, said first and second series of electrical conductors being insulated from one another, each conductor of said first and second series of electrical conductors having a capacitance that is sensitive to proximity of a finger for detecting a presence thereof, and each conductor of said first and second series of electrical conductors having a width in a range of about 10 microns to about 25 microns.*

*27. A touchpad comprising an electrically insulating membrane, a first series of spaced apart wires disposed on a first face of said membrane and a second series of spaced apart wires proximal to said membrane, said first and second series of wires being insulated from one another, each wire of said first and second series of wires having a capacitance that is sensitive to proximity of a finger for detecting a presence thereof, and each wire of said first and second series of wires having a width in a range of about 10 microns to about 25 microns.*

*28. A touchpad as recited in claim 27, wherein the width of each of the wires in the first and second series of wires is defined in a plane parallel to the membrane.*

*29. A touchpad comprising an electrically insulating membrane, a first series of spaced apart electrical conductors disposed on a first face of said membrane and a second series of spaced apart electrical conductors proximal to said membrane, said first and second series of electrical conductors being insulated from one another, each conductor of said first and second series of electrical conductors having a capacitance that is sensitive to proximity of a finger for detecting a presence thereof, and each conductor of said first and second series of electrical conductors having a width in a range of about 10 microns to about 25 microns.*

*30. A touch pad as recited in claim 29, wherein the width of each of the conductors in the first and second series of electrical conductors is defined in a plane parallel to the membrane.*

*31. A touchpad system comprising:*

*an electrically insulating membrane with a first series of spaced apart conductors on a first face of said membrane and a second series of spaced apart conductors on or proximal thereto, said first and second series of conductors being insulated from one another, each conductor in said first and second series of conductors having a capacitance that is sensitive to proximity of a finger for detecting a presence thereof, and said first and second series of conductors comprising conductors having a width in a range of about 10 microns to about 25 microns; and*

*a scanning system operative to sample each one of the conductors in turn from both said first and second series of conductors in order to measure and store a capacitance value associated with that respective conductor, said scanning system being operative to maintain all conductors of said first and second series of conductors at a common potential when said conductors are not actively being sampled by said scanning system.*

*32. A touchpad system comprising:*

*an electrically insulating membrane with a first series of spaced apart electrical conductors on a first face of said membrane and a second series of spaced apart electrical conductors proximal thereto, the first and second series of conductors being insulated from one another, each conductor of said first and second series of conductors having a capacitance that is sensitive to proximity of a finger for detecting a presence thereof, and said first and second series of conductors having a width in a range of about 10 microns to about 25 microns; and*

*a scanning system operative to sample a said one of said conductors in turn from both said first and second series of conductors in order to measure and store a capacitance value associated with that respective conductor, wherein the scanning system is operative to maintain all conductors that are not actively being sampled by said scanning system at a common potential equal to the potential of the conductor being sampled.*

*33. A touchpad system comprising:*

*an electrically insulating membrane with a first series of spaced apart electrical conductors on a first face of said membrane and a second series of spaced apart electrical conductors proximal thereto, said first and second series of conductors being insulated from one another, each conductor in said first and second series of conductors having a capacitance that is sensitive to proximity of a finger for detecting a presence thereof, and each conductor of said first and second series of conductors having a width in a range of about 10 microns to about 25 microns; and*

*a scanning system operative to sample a conductor in turn from both said first and second series of conductors in order to measure and store a capacitance value associated with that respective conductor, wherein said scanning system is operative to maintain all conductors of said first and second series of conductors that are not actively being sampled by said scanning system at a common potential equal to the potential of the conductor being sampled, said scanning system comprising:*

*a multiplexer, individual inputs of which are respectively connected to a first end of each respective conductor operative to scan each conductor of said first and second series of spaced apart conductors in a defined order such that only one conductor is connected to the output of said multiplexer at any time instant; and*

*voltage driving means an input of which is connected to the output of said multiplexer and an output of said voltage driving means is connected to all conductors of said first and second series of spaced apart conductors, said voltage driving means thereby maintaining the voltage level on each conductor of said first and second series of spaced apart conductors at a common*

*potential, which common potential is equal to the output voltage potential of the conductor being sampled at that time instant.*

*34. A touchpad useable as a touch screen comprising an electrically insulating membrane with a first series of spaced apart conductors on a face of said membrane and a second series of spaced apart conductors on or proximal thereto, the first and second series of conductors being insulated from one another, each conductor of said first and second series of conductors having a width in a range of about 10 microns to about 25 microns, and each conductor in said first and second series of conductors having a capacitance that is sensitive to proximity of a finger for detecting a presence thereof, wherein said first and second series of spaced apart conductors comprise insulation coated electrically conductive conductors.*

*35. A touchpad useable as a touch screen comprising an electrically insulating membrane with a first series of spaced apart conductors on a face of said membrane and a second series of spaced apart conductors on or proximal thereto, said second series of conductors being attached to said face of said insulating membrane, said first series of conductors being insulated from said second series of conductors by discrete regions of insulating material, the conductors of said first series of conductors intersecting at intersections with the conductors of said second series of conductors, each of the conductors of said first and second series of conductors having a first width for the larger part of their length, and a second width being substantially smaller than the first width, which second width is coincidental with each of said intersections, each conductor in said first and second series of conductors having a capacitance that is sensitive to proximity of a finger for detecting a presence thereof, wherein said first and second series of spaced apart conductors comprise fine electrically conductive conductors.*

*36. A touchpad system comprising:*

*a touchpad comprising an electrically insulating membrane with a first series of spaced apart conductors on a face of said membrane and a second series of spaced apart conductors on or proximal thereto, the first and second series of conductors being insulated from one another, each conductor of said first and second series of conductors having a width in a range of about 10 microns to about 25 microns, and each conductor of said first and second series of conductors having a capacitance that is sensitive to proximity of a finger for detecting a presence thereof, wherein said first and second series of spaced apart conductors comprise fine electrically conductive conductors; and*

*a scanning system operative to sample in turn each conductor from both said first and second series of conductors in order to measure and store a capacitance value associated with that respective conductor.*

*37. A touchpad system comprising:*

*a touchpad useable as a touch screen comprising an electrically insulating membrane with a first series of spaced apart conductors on a face of said membrane and a second series of spaced apart conductors on or proximal thereto, the first and second series of conductors being insulated from one another, each conductor of said first and second series of conductors having a capacitance that is sensitive to proximity of a finger for detecting a presence thereof, wherein said first and second series of conductors comprise fine electrically conductive conductors;*

*a scanning system operative to sample in turn each conductor from both said first and second series of conductors in order to measure and store a capacitance value associated with that respective conductor; and*

*an active backplane device;*

*wherein said scanning system is operative to maintain all conductors of said first and second series of conductors that are not being actively sampled by said scanning system at the same potential as said active backplane device.*

*38. A touchpad useable as a touch screen comprising an electrically insulating membrane with a first series of spaced apart conductors on a face of said membrane and a second series of spaced apart conductors on or proximal thereto, the first and second series of spaced apart conductors being insulated from one another, each conductor in said first and second series of conductors having a capacitance that is sensitive to proximity of a finger for detecting a presence thereof, wherein said first and second series of spaced apart conductors comprise fine electrically conductive conductors oriented in a zig-zag manner.*

*39. A touchpad comprising an electrically insulating membrane, a first series of spaced apart conductors disposed proximal a first face of the membrane, a second series of spaced apart conductors disposed between the first series of conductors and the membrane and crossing over the first series of conductors at a plurality of crossover points, and non-continuous insulation disposed between the first and second series of conductors at least at each of the crossover points to prevent electrical contact between the first and second series of conductors, each conductor of the first and second series of conductors having a capacitance that is sensitive to proximity of a finger for detecting a presence thereof.*

*40. A touchpad as recited in claim 39, wherein the non-continuous insulation disposed between the first and second series of conductors comprises isolated regions of insulating material disposed between the first and second series of conductors.*

*41. A touchpad comprising:*

*an electrically insulating membrane;*

*a first series of spaced apart conductors disposed proximal a first face of the membrane;*

*a second series of spaced apart conductors disposed between the first series of conductors and the membrane and crossing over the first series of conductors at a plurality of crossover points;*

*non-continuous insulation disposed between the first and second series of conductors to prevent electrical contact between the first and second series of conductors;*

*wherein each conductor of the first and second series of conductors has a capacitance that is sensitive to proximity of a finger for detecting a presence thereof; and*

*wherein conductors of at least one of the first and second series of conductors comprise insulated wires, the non-continuous insulation comprising insulation around the insulated wires.*

*42. A touchpad comprising an electrically insulating membrane, a first series of spaced apart electrical conductors disposed on a first face of the insulating membrane, and a second series of spaced apart electrical conductors disposed proximal to the membrane, said first and second series of conductors being insulated from one another, each conductor of the first and second series of conductors having a capacitance that is sensitive to proximity of a finger for detecting a presence thereof, the membrane and the first and second series of conductors being encapsulated within a dielectric material.*

*43. A touchpad as recited in claim 42, wherein the dielectric material is a dielectric laminate.*

*44. A touchpad as recited in claim 42, wherein the second series of spaced apart conductors is disposed on a second side of the membrane opposite the first side of the membrane.*

*45. A touchpad as recited in claim 42, wherein the first series of spaced apart conductors is disposed between the membrane and the second series of spaced apart conductors, an electrical insulating layer being disposed between the first and second series of spaced apart conductors.*

*46. A touchpad as recited in claim 42, wherein the first series of spaced apart conductors is disposed between the membrane and the second series of spaced apart conductors, and further comprising discrete portions of insulating material disposed at intersections between conductors of the first and second series of spaced apart conductors.*

*47. A touchpad as recited in claim 42 wherein the dielectric laminate is a plastic film.*

*48. A touchpad useable as a touch screen comprising an electrically insulating membrane with a series of spaced apart conductors on a face of said membrane, each conductor in the series of conductors having a capacitance that is sensitive to proximity of a finger for detecting a presence thereof, the conductors following non-rectilinear paths so as to define respective detection areas on the membrane.*

*49. A touchpad as recited in claim 48, wherein the conductors form an array of discrete pad areas.*

*50. A touchpad as recited in claim 48, wherein the conductors follow enclosed paths so as to define enclosed detection areas.*

*51. A touchpad as recited in claim 48, wherein the detection areas are arranged on the touchpad in a keyboard pattern.*

*52. A touchpad as recited in claim 48, wherein the conductors follow zig-zag paths across the membrane.*

*53. A touchpad comprising*

*an electrically insulating membrane;*

*a first grid of electrical conductors disposed proximate the membrane, the electrical conductors of the first grid having a capacitance that is sensitive to proximity of a finger for detecting a presence thereof; and*

*at least a second grid of electrical conductors disposed between the first grid of conductors and the membrane, the electrical conductors of the second grid having a capacitance that is sensitive to proximity of a finger for detecting a presence thereof, a grid spacing of the second grid being different from a grid spacing of the first grid.*

*54. A touchpad as recited in claim 53, wherein the first grid of electrical conductors comprises a first series of spaced apart electrical conductors disposed on a first face of the membrane and a second series of spaced apart electrical conductors disposed proximate the membrane, and the second grid of electrical conductors comprises a third series of spaced apart electrical conductors and a fourth series of spaced apart electrical conductors disposed proximate the membrane.*

*55. A touchpad as recited in claim 53, further comprising a scanning system to determine a position of the finger relative to the touchpad based on a position of the finger relative to the first grid and relative to the second grid.*

*56. A touchpad as recited in claim 53, wherein one of the first and second grids defines duplicate sets of relatively small touch areas forming a large touch area array, and the other first and second grids defines relatively large touch areas so that detection of a finger by at least one of the small touch areas and by one of the large touch areas defines a unique position on the touchpad.*

*57. A touchpad system comprising:*

*a touchpad useable as a touch screen, comprising:*

*an electrically insulating membrane;*

*a first series of spaced apart conductors on a face of said membrane; and*

*a second series of spaced apart conductors on or proximate the membrane;*

*wherein the first and second series of conductors are insulated from one another, each conductor of said first and second series of conductors has a capacitance that is sensitive to proximity of a finger for detecting a presence thereof, and no conducting backplane is present behind the first and second series of spaced apart conductors; and*

*a scanning system coupled to the touchpad to sample each conductor from both said first and second series of conductors in order to measure and store a capacitance value associated with that respective conductor, the scanning system maintaining all conductors of said first and second series of conductors at a first potential when the conductors are not being actively sampled by said scanning system, the first potential being related to a signal applied to the conductor being sampled.*

*58. A touchpad system as recited in claim 57, wherein the signal applied to the conductor being sampled oscillates in value by an oscillation magnitude and the first potential oscillates in value by an amount equal to the oscillation magnitude.*

*59. A touchpad system as recited in claim 58, further comprising a non-inverting unity gain amplifier to generate the first potential based on the signal applied to the conductor being sampled.*

*60. A touchpad as recited in claim 57, wherein the conductors have a width in a range of about 10 microns to about 25 microns.*

*61. A touchpad system comprising:*

*a touchpad useable as a touch screen, comprising:*

*an electrically insulating membrane;*

*a first series of spaced apart conductors on a face of said membrane; and*

*a second series of spaced apart conductors on or proximate the membrane; wherein the first and second series of conductors are insulated from one another, each conductor of said first and second series of conductors has a capacitance that is sensitive to proximity of a finger for detecting a presence thereof; and*

*a conducting backplane disposed behind the first and second series of conductors, at least a portion of the conducting backplane extending in front of the first and second series of conductors; and*

*a scanning system coupled to the touchpad to sample each conductor from both said first and second series of conductors in order to measure and store a capacitance value associated with that respective conductor, the scanning system maintaining all conductors of said first and second series of conductors and the conducting backplane at a first potential when the conductors are not being actively sampled by said scanning system, the first potential being related to a signal applied to the conductor being sampled.*

*62. A touchpad system comprising:*

*a touchpad useable as a touch screen, comprising:*

*an electrically insulating membrane;*

*a first series of spaced apart conductors on a face of said membrane; and*

*a second series of spaced apart conductors on or proximate the membrane;*

*wherein the first and second series of conductors are insulated from one another, each conductor of said first and second series of conductors has a capacitance that is sensitive to proximity of a finger for detecting a presence thereof; and*

*a scanning system coupled to the touchpad to sample each conductor from both said first and second series of conductors in order to measure and store a capacitance value associated with that respective conductor, the scanning system applying a probe signal to the respective conductor at a frequency dependent on the capacitance of the respective conductor and being coupled to apply a first potential to the conductors not being sampled, the first potential being derived from the probe signal applied to the respective conductor.*

*63. A touchpad system as recited in claim 62, further comprising a backplane disposed behind the first and second series of conductors, the scanning system coupled to apply the first potential to the backplane.*

*64. A touchpad comprising:*

*a dielectric medium;*

*a plurality of conductors disposed in proximity to the dielectric medium throughout a touch sensitive area, each of the conductors being transverse to at least one other of the conductors along respective segments thereof to establish a plurality of pairs of transverse conductive segments; and*

*a plurality of intervening insulating regions respectively disposed at least between the transverse conductive segments of the pairs;*

*wherein at least one segment within each pair of transverse conductive segments has an effective width in a range of about 10 microns to about 25 microns.*

*65. The touchpad of claim 64 wherein each of the segments having an effective width in a range of about 10 microns to about 25 microns is a region of one of the conductors having a generally constant width in a range of about 10 microns to about 25 microns throughout the touch sensitive area.*

*66. The touchpad of claim 64 wherein each of the segments having an effective width in a range of about 10 microns to about 25 microns is a reduced width region of one of the conductors generally having a width greater than about 25 microns throughout the touch sensitive area.*

*67. The touchpad of claim 66 wherein the reduced width region is a narrowed region.*

*68. The touchpad of claim 66 wherein the reduced width region is a window-containing region.*

*69. A touchpad comprising:*

*a dielectric medium;*

*a plurality of conductors disposed in proximity to the dielectric medium throughout a touch sensitive area, each of the conductors being transverse to at least one other of the conductors along respective segments thereof to establish a plurality of pairs of transverse conductive segments; and*

*a plurality of intervening insulating regions respectively disposed at least between the transverse conductive segments of the pairs,*

*wherein at least one segment within each pair of transverse conductive segments is a reduced width region of one of the conductors.*

*70. The touchpad of claim 69 wherein the reduced width region is a narrowed region.*

*71. The touchpad of claim 69 wherein the reduced width region is a window-containing region.*

*72. A touchpad system comprising:*

*a surface;*

*a plurality of conductors, each of the conductors having at least a segment thereof disposed in proximity to the surface for capacitively coupling through the surface to a finger brought into proximity with the segment;*

*a capacitance-controlled oscillator having a frequency of oscillation that is sensitive to capacitance at an input thereof, and an amplitude of oscillation;*

*a switch for successively coupling the input of the oscillator to the conductors, wherein when at least one of the conductors is coupled to the input of the oscillator through the switch, at least one of the conductors is uncoupled to the input of the oscillator; and*

*a source of electric potential having an output for supplying a first potential to the uncoupled conductor or conductors.*

*73. The touchpad system of claim 72 wherein the first potential is a ground potential.*

*74. The touchpad system of claim 72 wherein the first potential is a common potential.*

*75. The touchpad system of claim 72 wherein the source of electric potential has an input coupled to the oscillator, the first potential being related to the frequency and amplitude of oscillation of the oscillator.*

*76. The touchpad system of claim 72 wherein:*

*the oscillator operationally places a second potential on the coupled conductor or conductors, the second potential having a frequency and amplitude at least in part determined by the capacitance of the coupled conductor or conductors; and*

*the source of electric potential comprises a unity gain non-inverting amplifier having an input coupled to the oscillator, and an output for providing the first potential at a frequency and amplitude substantially equal to the frequency and amplitude of the second potential.*

*77. The touchpad system of claim 72 further comprising a backplane coupled to the output of the source of electric potential, the conductors respectively having front sides facing the surface and back sides opposite the surface, and the backplane extending across the conductors along the back sides thereof.*

*78. The touchpad system of claim 77 wherein the backplane further extends along a portion of the front sides of the conductors.*

*79. The touchpad system of claim 72 wherein a first set of the conductors extend generally parallel to the surface in a first direction and a second set of the conductors extend generally parallel to the surface in a second direction, each of the conductors of the first set being transverse to the conductors of the second set and insulated therefrom at least where transverse, and each of the conductors of the second set being transverse to the conductors of the first set and insulated therefrom at least where transverse.*

*80. The touchpad system of claim 79 wherein:*

*the conductors of the first set are generally of a predetermined width relative to the surface, and are generally parallel to one another with intervening spacings much greater than the width thereof; and*

*the conductors of the second set are generally of a predetermined width relative to the surface, and are generally parallel to one another with intervening spacings much greater than the width thereof.*

*81. The touchpad system of claim 72 further comprising:*

*a converter coupled to the oscillator for providing digital values indicative of the frequency of oscillation of the oscillator, the digital values being related to the capacitances of the conductors;*

*a memory coupled to the converter for storing a succession of the digital values for each of the conductors over a plurality of different scans; and*

*a comparator coupled to the memory for comparing the digital values from the different scans to detect presence and position of a finger in proximity to the touchpad.*

*82. The touchpad system of claim 72 wherein the conductors are silver-based conductive ink.*

*83. The touchpad system of claim 72 wherein the conductors are conductive elements of a printed circuit board.*

*84. The touchpad system of claim 72 wherein the conductors are wires.*

*85. The touchpad system of claim 84 wherein at least one of the wires comprises a zigzagged portion.*

*86. The touchpad system of claim 72 wherein the conductors are essentially invisible to the naked eye.*

*87. The touchpad system of claim 86 wherein the conductors are fine wires.*

*88. The touchpad system of claim 87 wherein at least one of the fine wires comprises a zigzagged portion.*

*89. The touchpad system of claim 87 wherein the fine wires have a diameter in a range of about 10 microns to about 25 microns.*

*90. The touchpad system of claim 87 wherein the fine wires are insulated wires having a diameter in a range of about 10 microns to about 25 microns.*

*91. The touchpad system of claim 86 wherein the conductors are indium oxide.*

*92. A touchpad system comprising:*

*a surface;*

*a first plurality of wires disposed in proximity to the surface;*

*a second plurality of wires disposed in proximity to the surface;*

*a capacitance-controlled oscillator having a frequency of oscillation that is sensitive to capacitance at an input thereof; and*

*a switch for successively coupling the input of the oscillator to the wires;*

*wherein each of the wires of the first and second plurality of wires is disposed in proximity to the surface for capacitively coupling through the surface to a finger brought into proximity with the wire; and*

*wherein the first plurality of wires extends generally parallel to the surface in a first direction and the second plurality of wires extends generally parallel to the surface in a second direction, each of the wires in the first plurality of wires being transverse to the wires in the second plurality of wires and insulated therefrom at least where transverse, and each of the wires of the second plurality of wires being transverse to the wires of the first plurality and insulated therefrom at least where transverse.*

*93. The touchpad system of claim 92 wherein at least one of the wires comprises a zigzagged portion.*

*94. The touchpad system of claim 92 wherein the wires are fine wires that are essentially invisible to the naked eye.*

*95. The touchpad system of claim 94 wherein at least one of the fine wires comprises a zigzagged portion.*

*96. The touchpad system of claim 94 wherein the fine wires have a diameter in a range of about 10 microns to about 25 microns.*

*97. The touchpad system of claim 94 wherein the fine wires are insulated wires having a diameter in a range of about 10 microns to about 25 microns.*

*98. A touchpad comprising:*

*a touch surface;*

*a plurality of insulation coated wires respectively having at least one zigzagged portion disposed in proximity to the touch surface for allowing a finger in proximity to the zigzagged portion to capacitively couple thereto through the touch surface.*

*99. The touchpad system of claim 98 wherein the insulation coated wires are fine insulation coated wires.*

*100. The touchpad system of claim 99 wherein the fine insulation coated wires have a diameter in a range of about 10 microns to about 25 microns.*

* * * * *